United States Patent
Park et al.

(10) Patent No.: US 7,887,715 B1
(45) Date of Patent: Feb. 15, 2011

(54) CHEMICAL MECHANICAL POLISHING SLURRY COMPOSITION INCLUDING NON-IONIZED, HEAT ACTIVATED NANO-CATALYST AND POLISHING METHOD USING THE SAME

(75) Inventors: Jong Dai Park, Hwaseong-si (KR); Jin Hyuk Lim, Hwaseong-si (KR); Jung Min Choi, Hwaseong-si (KR); Hyun Goo Kong, Hwaseong-si (KR); Jae Hyun Kim, Hwaseong-si (KR); Hye Jung Park, Hwaseong-si (KR)

(73) Assignee: Dongjin Semichem Co., Ltd., Incheon (KR)

( * ) Notice: Subject to any disclaimer, the term of this patent is extended or adjusted under 35 U.S.C. 154(b) by 0 days.

(21) Appl. No.: 12/643,645

(22) Filed: Dec. 21, 2009

(30) Foreign Application Priority Data

Aug. 12, 2009 (KR) .................. 10-2009-0074344

(51) Int. Cl.
*C09K 13/04* (2006.01)
(52) U.S. Cl. .................. 252/79.1; 252/79.2; 438/692; 216/88
(58) Field of Classification Search .............. 252/79.1, 252/79.2, 79.3; 438/692, 693, 691; 216/88, 216/89
See application file for complete search history.

(56) References Cited

U.S. PATENT DOCUMENTS

| 5,221,497 | A | 6/1993 | Watanabe et al. |
| 5,861,055 | A | 1/1999 | Allman et al. |
| 6,177,026 | B1 * | 1/2001 | Wang et al. .................. 252/79.1 |
| 6,383,065 | B1 | 5/2002 | Grumbine et al. |
| 2001/0036804 | A1 * | 11/2001 | Mueller et al. .............. 451/526 |
| 2003/0186634 | A1 * | 10/2003 | Nishida et al. .............. 451/330 |
| 2004/0006924 | A1 | 1/2004 | Scott et al. |
| 2004/0029495 | A1 | 2/2004 | Small et al. |
| 2005/0121377 | A1 | 6/2005 | Koga et al. |
| 2008/0096363 | A1 * | 4/2008 | Govindarajan .............. 438/396 |
| 2009/0120012 | A1 | 5/2009 | Park et al. |

FOREIGN PATENT DOCUMENTS

KR 10-1998-0042755 8/1998

(Continued)

*Primary Examiner*—Lan Vinh
(74) *Attorney, Agent, or Firm*—Edwards Angell Palmer & Dodge LLP; Kongsik Kim

(57) ABSTRACT

Disclosed herein are a chemical mechanical polishing slurry composition for chemical mechanical planarization of metal layers, which comprises a non-ionized, heat-activated nano-catalyst, and a polishing method using the same. The polishing slurry composition comprises: a non-ionized, heat-activated nano-catalyst which releases electrons and holes by energy generated in a chemical mechanical polishing process; an abrasive; and an oxidizing agent. The non-ionized heat-activated nano-catalyst and the abrasive are different from each other, and the non-ionized, heat-activated nano-catalyst is preferably a semiconductor material which releases electrons and holes at a temperature of 10 to 100° C. in an aqueous solution state, more preferably a transition metal silicide selected from the group consisting of CrSi, MnSi, CoSi, ferrosilicon (FeSi), mixtures thereof, and most preferably, a semiconductor material such as nano ferrosilicon. The content of the content of the non-ionized, heat-activated nano-catalyst is 0.00001 to 0.1 wt % based on the total weight of the slurry composition.

12 Claims, 5 Drawing Sheets

FOREIGN PATENT DOCUMENTS

| KR | 10-2000-7013224 | 5/2001 |
| KR | 2004-0045639 A | 6/2004 |
| KR | 10-2004-7012423 | 8/2004 |
| KR | 10-2004-0093716 | 11/2004 |
| KR | 2005-0018499 A | 2/2005 |
| KR | 2005-0040170 A | 5/2005 |
| KR | 10-2008-7013367 | 7/2008 |

* cited by examiner (a)

(b)

CHEMICAL MECHANICAL POLISHING SLURRY COMPOSITION INCLUDING NON-IONIZED, HEAT ACTIVATED NANO-CATALYST AND POLISHING METHOD USING THE SAME

CROSS-REFERENCE TO RELATED APPLICATIONS

This application claims the benefit of Korean Patent Application No. 10-2009-74344, filed On Dec. 8, 2009, which is incorporated herein by reference in its entirety.

BACKGROUND OF THE INVENTION (a) Field of the Invention

The present invention relates to a chemical mechanical polishing slurry composition which is used in the manufacture of semiconductor chips, and more particularly to a polishing slurry composition, which comprises a non-ionized, heat-activated nano-catalyst and is particularly useful for a process for chemical mechanical planarization of a metal layer, and to a polishing method using the same.

(b) Background of the Related Art

Semiconductor chips to which integrated circuit technology has been applied include numerous functional elements (devices), including transistors, capacitors, resistors and the like. Such individual functional elements are connected to each other by interconnects designed in specific shapes to form circuits. Integrated circuits have become smaller over time, and thus the function of one chip is also gradually increasing. In miniaturization of semiconductor chips, simply decreasing the size of devices has limitations, and thus studies on multilayer interconnect structures for forming each device in a multilayer structure have recently been actively conducted. To manufacture semiconductor devices having such multilayer interconnect structures, a process of planarizing metal layers by polishing must be carried out. However, because the metal layers are not easy to polish due to their high strength, in order to effectively polish the metal layer, the polishing process must be carried out after oxidizing the metal layers in the form of metal oxides having relatively low strength.

However, conventional chemical mechanical polishing slurry compositions have a shortcoming in that the efficiency of a chemical conversion process of oxidizing metal layers in the form of metal oxides is insufficient. Meanwhile, Korean Patent Registration No. 745447 discloses a method of promoting the oxidation of metal layers using a polishing slurry composition comprising hydrogen peroxide and iron salt (iron ion). However, because the disclosed method uses a large amount of iron salt, a metal layer being polished can be contaminated by iron ions, resulting in defects, or iron ions can remain on plugs (contacts between interconnects) to cause excessive oxidation, resulting in excessive etching. Thus, the choice of oxidizing agents and polishing particles, which can effectively oxidize a metal layer, to be polished, without causing defects on the metal layer, and the control of the concentration thereof are very critical to the development of chemical mechanical polishing (CMP) compositions.

Regarding catalysts and oxidizing agents, which are used in the chemical mechanical polishing processes, Korean Patent Laid-Open Publication No. 2001-0043798 discloses a metal oxide (e.g., $TiO_2$) catalyst such as metal oxide (e.g., $TiO_2$). However, the metal oxide (e.g., $TiO_2$) catalyst is a photo-activated catalyst which has a problem in that it requires irradiation of light onto the catalyst between a substrate on which a CMP composition is applied and a pad for photo-activation of the catalyst. Moreover, Korean Patent Registration No. 10-736325 discloses a CMP composition in which an activating agent selected from the group consisting of metals known to be activated by Fenton oxidation are bound to the surface of particles and fluid. However, the CMP composition has a problem in that a metal layer being polished can be contaminated by the activating agent Fe ion, because the activating agent has a plurality of oxidation numbers even when the activating agent is not separated from the particles. Another problem is that an organic additive for reducing the contamination level is required.

In addition, U.S. Pat. No. 5,861,055 and Korean Patent Laid-Open Publication No. 2008-0070053 disclose chemical mechanical slurry compositions which comprise a metal silicide component as an abrasive, but recognize metal silicide as one of simple abrasives rather than an activating agent.

SUMMARY OF THE INVENTION

Accordingly, the present inventors have made many efforts to the above-mentioned problems occurring in the prior art, and as a result, have found that, when a chemical mechanical slurry composition which comprises a non-ionized, heat-activated nano-catalyst without having metal (Fe) ions, is used, contamination by metals during a polishing process can be reduced and excessive oxidation reactions can be prevented to increase polishing efficiency, thereby completing the present invention.

It is an object of the present invention to provide a chemical mechanical polishing slurry composition which utilizes a non-ionized, heat-activated nano-catalyst adopting a novel mechanism of releasing electrons and holes by energy generated in a chemical mechanical polishing process.

Another of the present invention is to provide a chemical mechanical polishing slurry composition which can promote the oxidation of a metal layer using a novel, non-ionized, heat-activated nano-catalyst instead of using large amounts of iron ions (iron salts) and hydrogen peroxide and can easily polish a metal layer.

Still another object of the present invention is to provide a chemical mechanical polishing slurry composition which utilizes a non-ionized, heat-activated nano-catalyst and does not require an organic additive for reducing the level of contamination by metal ions, in which the non-ionized, heat-activated nano-catalyst has excellent stability and does not cause substrate contamination resulting from the generation of metal ions, and a polishing method using the same.

To achieve the above objects, the present invention provides a chemical mechanical polishing slurry composition comprising: a non-ionized, heat-activated nano-catalyst which releases electrons and holes by energy generated in a chemical mechanical polishing process; an abrasive; and an oxidizing agent, wherein the non-ionized, heat-activated nano-catalyst and the abrasive are different from each other, the non-ionized, heat-activated nano-catalyst is preferably a semiconductor material which releases electrons and holes at a temperature of 10 to 100° C. in an aqueous solution state, more preferably a transition metal silicide selected from the group consisting of CrSi, MnSi, CoSi, ferrosilicon (FeSi), mixtures thereof, and most preferably, a semiconductor material such as nano ferrosilicon. Also, the content of the non-ionized, heat-activated nano-catalyst is 0.00001 to 0.1 wt %. The content of the abrasive is preferably 0.1 to 20.0 wt %.

The present invention also provides a method for polishing a substrate, comprising the steps of: applying a chemical mechanical polishing slurry composition, comprising a non-ionized, heat-activated nano-catalyst releasing electrons by energy generated in a chemical mechanical polishing process, an abrasive and an oxidizing agent, to a substrate having a metal layer formed thereon; bringing the substrate having the chemical mechanical polishing composition applied thereto into contact with a polishing pad, and moving the polishing pad against the substrate; and removing at least a portion of the metal layer from the substrate, wherein the non-ionized, heat-activated nano-catalyst and the abrasive are different from each other, and the content of the non-ionized, heat-activated nano-catalyst is 0.00001 to 0.1 wt % based on the total weight of the chemical mechanical polishing slurry composition.

The prior chemical mechanical polishing slurry composition for polishing tungsten (W) contains a large amount of metal (iron) ions. For this reason, after a process of polishing a wafer, the wafer surface can be contaminated by a large amount of metal (iron) ions, and slurry remaining on the wafer can additionally corrode the tungsten plug, thus causing a short circuit in the plug. Also, the substrate can be contaminated by a large amount of metal ions, and an organic additive must be added to the composition in order to reduce the level of contamination by metal ions. On the contrary, in the chemical mechanical polishing slurry composition according to the present invention, metal (ion) ions are not present in the slurry, and thus the metal contamination of a wafer after polishing of the wafer is low. Also, the CMP composition of the present invention does not cause any additional oxidation reaction except for an oxidation reaction in the CMP process, and thus before and after the CMP process or during the interruption of the CMP process, it does not cause tungsten plug corrosion resulting from an unintended additional reaction. Furthermore, the slurry composition according to the present invention has advantages in that it does not require an organic additive for reducing metal (Fe) contamination levels, has a low content of silica particles compared to the prior tungsten (W) polishing slurry, and shows a high tungsten (W) polishing rate and excellent post-polish roughness.

BRIEF DESCRIPTION OF THE DRAWINGS

The above and other objects, features and advantages of the present invention will be apparent from the following detailed description of the preferred embodiments of the invention in conjunction with the accompanying drawings, in which:

FIG. 4(*b*) shows XPS results of binding states in a narrow scan region.

DETAILED DESCRIPTION OF THE PREFERRED EMBODIMENT

Figure 1:
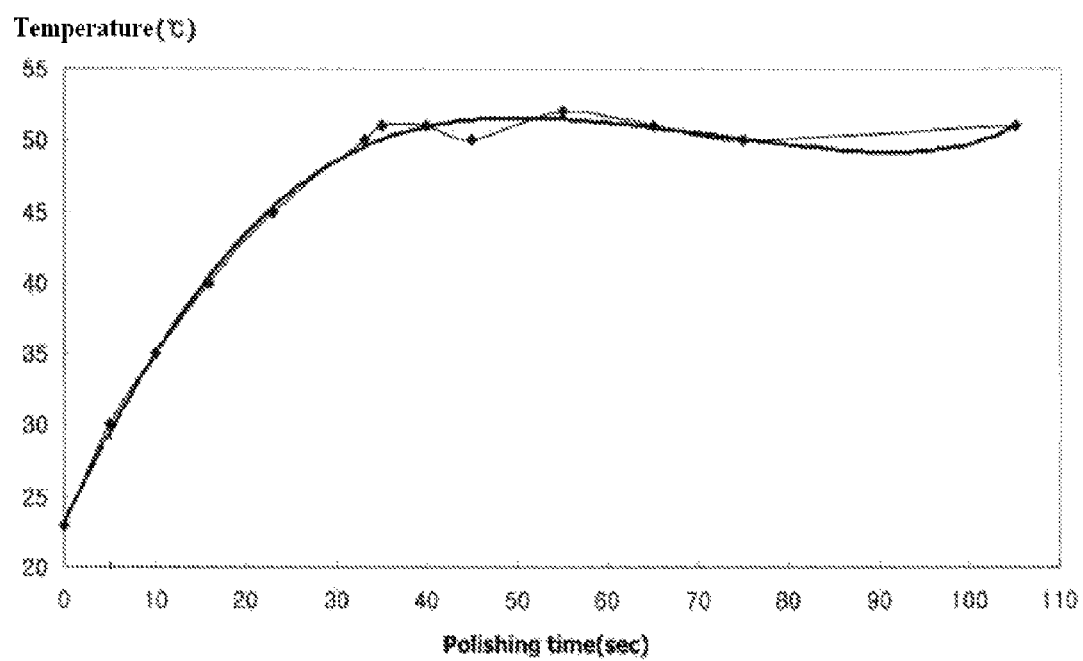
FIG. 1 is a graph showing a change in the temperature of the surface of a pad in the case of polishing a tungsten (W) film using a chemical mechanical polishing slurry composition according to the present invention.

The present invention relates to a chemical mechanical polishing slurry composition comprising: a non-ionized, heat-activated nano-catalyst which releases electrons and holes by energy generated in a chemical mechanical polishing process; an abrasive; and an oxidizing agent, wherein the non-ionized, heat-activated nano-catalyst and the abrasive are different from each other, and the content of the content of the non-ionized, heat-activated nano-catalyst is 0.00001 to 0.1 wt %.

Hereinafter, the present invention will be described in detail.

A chemical mechanical polishing (CMP) slurry composition according to the present invention comprises a non-ionized, heat-activated nano-catalyst, an abrasive and an oxidizing agent, wherein the non-ionized, heat-activated nano-catalyst and the abrasive are different from each other. The non-ionized, heat-activated nano-catalyst which is used in the chemical mechanical polishing slurry composition according to the present invention is a semiconductor material which releases electrons and/or holes by energy generated in a chemical mechanical polishing process, in which the released electrons react with an oxidizing agent such as hydrogen peroxide to produce hydroxyl radicals. The semiconductor material has a low energy band gap. The mechanism by which the non-ionized, heat-activated nano-catalyst releases electron and holes by energy generated in a chemical mechanical polishing process is as follows:

nano FeSi→$e^-$(release)+$h^+$(surface)

$e^- + H_2O_2 \rightarrow \cdot OH + OH^-$ $e^- + O_2 \rightarrow O_2^-$ (super oxide radical)

$2O_2^- + 2H_2O \rightarrow 2\cdot OH + 2OH^- + O_2$ $2h^+ + 2OH^- \rightarrow 2\cdot OH$ $6\cdot OH + W \rightarrow WO_3 + 3H_2O$ A semiconductor material which can be used as the non-ionized, heat-activated nano-catalyst releases electron is a material releasing electrons and holes in an aqueous solution state at a temperature of 10 to 100° C., preferably 20 to 80° C., and more preferably 30 to 70, and preferably has an energy band gap of 0.001-3.0 eV, and preferably 0.005-2.0 eV. Herein, if the temperature is too low, electrons and holes cannot occur, and if the temperature is too high, non-uniform polishing can be performed due to an abrupt reaction. If the energy band gap is too low, the material can become conductive to lose its catalytic function, and if it is too high, excitation of the catalyst by energy generated in the polishing process cannot be achieved. The non-ionized, heat-activated nano-catalyst consists of nano-sized particles. Specifically, the nano-catalyst has a particle size of 1-1,000 nm, preferably 1-20 nm, and more preferably 2-10 nm. If the particle size of the non-ionized, heat-activated nano-catalyst is too small, the nano-catalyst cannot be formed of particles, and if the particle size is too large, the catalyst activity can be decreased or the catalyst can cause defects such as scratches in the polishing process.

As the non-ionized, heat-activated nano-catalyst, a transition metal silicide represented by MSi (M: transition meal)

may be used. It is generally known that transition metal silicides are inactive in aqueous solution and non-reactive, but react with molten KOH, KF, KCl and the like at high temperatures. Examples of the transition metal silicide include CrSi, MnSi, CoSi, ferrosilicon (FeSi) and the like, and a particularly preferred example of the non-ionized, heat-activated nano-catalyst is ferrosilicon (FeSi) having a particle size of about 4-5 nm. Ferrosilicon synthesized to have a nanometer size is very highly active, and thus has a characteristic in that it is sufficiently activated by thermal energy generated in the CMP process.

As described in the specification of Korean Patent Registration No. 10-850877 registered in the name of the applicant, the above ferrosilicon (FeSi) can be prepared by allowing a silica salt such as $SiCl_4$ in an aqueous solution in the presence of an iron salt such as $FeCl_3$.

Also, as described in the specification of Korean Patent Application No. 10-2009-42594 filed in the name of the applicant, the above ferrosilicon (FeSi) can be prepared by a method of preparing transition metal silicide using supercritical fluid, the method comprising the steps of: introducing a transition metal compound and an organic solvent into a reaction tank, and heating and pressurizing the introduced materials, such that the organic solvent reaches a supercritical state; introducing a silicon compound into the reaction tank; and transferring the mixture solution of the reaction tank to an impurity removal tank, and removing the organic solvent and unreacted material.

In the ferrosilicon (FeSi) described in the specifications of the registered invention and filed invention of the applicant, unreacted ions can exist as impurities after the preparation process, the removal of ions from the reaction solution in a process of preparing a heat-activated, solid polishing composition can be carried out using an ion exchange resin method in which impurities in the composition are treated with, for example, ion exchange resin, such that the composition can be exchanged with $OH^-$ and $H^+$ ions.

Moreover, the ferrosilicon (FeSi), an alloy of iron and silicon, is conventionally prepared as a melt in a melting furnace, an electric furnace or the like and has a silicon content of about 15-90 wt % for commercially available products. The content of iron (Fe) in the ferrosilicon (FeSi) is preferably 0.01-99 wt %, and more preferably 0.1-50 wt %. If the content of the iron (Fe) component is too low, the ferrosilicon cannot be activated by the energy of the polishing process, and if the content is too high, the ferrosilicon can become conduct to lose its catalytic function.

The transition metal silicide including the ferrosilicon (FeSi) can be prepared by a liquid-phase method, a solid-phase method or a vapor-phase method, which are used to prepare nanoparticles. Moreover, it can also be prepared while controlling physical properties using a supercritical method. The content of each component in the transition metal silicide which is used in the preset invention can be selected within a range which does not impair the object of the present invention, depending on the configurations of structures and elements of semiconductor devices having a multilayer interconnect structure. Specifically, the content of each component in the transition metal silicide can be selected in a wide range of 0.0001-99.9999 wt %, preferably 0.1-99.9 wt %, more preferably 1-99 wt %, and most preferably 10-90 wt %.

The non-ionized, heat-activated nano-catalyst according to the present invention releases electrons and holes in a chemical mechanical polishing process, which react with an oxidizing agent such as hydrogen peroxide to produce very strongly hydroxyl radicals, thus oxidizing a metal layer. The content of the non-ionized, heat-activated nano-catalyst in the chemical mechanical polishing slurry composition according to the present invention is 0.00001-0.1 wt %, 0.00005-0.07 wt %, more preferably 0.0001-0.05 wt %, and most preferably 0.001-0.03 wt %, based on the total weight of the composition. If the content of the non-ionized, heat-activated nano-catalyst is too low, the catalytic action can be insufficient, and if the content is too high, the reactivity of the non-ionized can be excessively increased, thus causing non-uniform polishing.

The chemical mechanical polishing slurry composition according to the present invention comprises an oxidizing agent which forms an oxide layer on the surface of a metal layer during polishing, in which the formed layer helps to polish the metal layer. Examples of the oxidizing agent which can be used in the present invention include monopersulfates, persulfates, peroxides, periodates, and mixtures thereof. Preferably, hydrogen peroxide may be used. Examples of the monoperoxides include $KHSO_5$, $KHSO_4$, $K_2SO_4$ and the like, and examples of the peroxide compounds include hydrogen peroxide, benzoyl peroxide, peracetic acid, di-t-butyl peroxide, sodium peroxide, etc. The content of the oxidizing agent which is included in the slurry composition of the present invention is preferably 0.1-10.0 wt %, and 0.2-5.0 wt %, based on the total weight of the composition. If the content of the oxidizing agent is less than 0.1, the formation of an oxide layer can be insufficient, and if the content of the oxidizing agent is more than 10.0 wt %, polishing efficiency can be decreased. The oxidizing agent reacts with the electrons and holes released from the heat-activated nano-catalyst activated by thermal energy to produce highly reactive hydroxyl radicals (–OH).

The slurry composition of the present invention comprises a conventional abrasive which performs the mechanical polishing of a metal layer. Example of the abrasive which can be used in the present invention include fumed silica such as silica or colloidal silica, alumina such as γ-alumina or α-alumina, ceria, Germania, titania, zirconia, etc. These abrasives may be used alone or in combination, and fumed silica is preferred. The size of the abrasive is generally less than 1.0 μm, and preferably less than 400 nm, and the content of the abrasive is 0.1-20.0 wt %, and preferably 0.5-10.0 wt %, based on the total weight of the composition. If the content of the abrasive is less than 0.1 wt %, the polishing of a metal layer can be insufficient, and if the content of the abrasive exceeds 20.0%, the stability of the slurry can be reduced.

The remaining component of the slurry composition according to the present invention is water, preferably deionized water or distilled water. If necessary, the slurry composition of the present invention may contain a dispersing agent for inhibiting the gelling and particle precipitation caused by storage temperature and aging and maintaining dispersion stability, and a reaction regulating agent for regulating the non-uniform reaction of the oxidizing agent resulting from the difference in the roughness of a substrate. As the reaction regulating agent, malonic acid may be used in a suitable amount, and organic additives for reducing the level of metal ion contamination, such as dihydroxy enol compounds and ascorbic acid, are not required in the present invention. The slurry composition of the present invention may further comprise conventional additives such as a buffer solution for inhibiting the effect of a change in pH. The pH of the slurry composition according to the present invention is 1-10, preferably 1-9, and more preferably 1-7. If the pH of the slurry composition is less than 1, the particles of the composition can be agglomerated to form gel, and if the pH of the composition exceeds 10, an oxidation reaction can be insufficient.

In order to adjust the pH of the slurry composition to the above range, a pH adjusting agent may be added, if necessary. Examples of the pH adjusting agent which can be used in the present invention include inorganic acids such as nitric acid, sulfuric acid, hydrochloric acid or phosphoric acid, and organic acids such as tartaric acid, citric acid, oxalic acid or benzoic acid.

The composition of the present invention can be prepared by any known method depending on the configurations of the structures and elements of semiconductor devices having a multilayer structure. For example, the composition of the present invention can be prepared by adding an abrasive and a non-ionized, heat-activated nano-catalyst to an aqueous medium such as deinized water or distilled water at required concentrations, and then adding an oxidizing agent or an oxidizing agent aqueous solution to the aqueous medium. In addition, conventional additives such as a dispersing agent may be added to the composition of the present invention by any conventional method. It is to be understood that organic additives for reducing the level of metal ion contamination, such as dihydroxy enol compounds and ascorbic acid, are not required in the present invention.

The components of the inventive composition may be mixed with each other immediately before they are used in a polishing process. Alternatively, the components may also be used in a polishing process after a given time after mixing. Alternatively, the components may be provided as more than two package units containing one or more components, and then the components contained in the package units may be mixed with each other immediately before carrying out the polishing process. In order to use the slurry composition of the present invention to polish a substrate such as a wafer, a silicon substrate or a glass substrate, particularly with a metal layer formed thereon, the slurry composition is applied to the substrate, a polishing pad is brought into contact with the substrate, and the polishing pad is moved against the substrate to remove at least a portion of the metal layer. Substrates which can be polished by the polishing composition of the present invention can be exemplified by substrates including at least one metal layer, for example, a titanium layer, a titanium nitride layer or a tungsten layer, and preferably substrates including a tungsten layer.

Hereinafter, the present invention will be described in further detail with reference to examples. It is to be understood, however, that these examples are illustrative purposes only and are not to be construed to limit the scope of the present invention.

Examples 1 to 5 and Comparative Example 1

Tests of Tungsten Layers for Polishing Rate at Various Silica Contents

As shown in Table 1 below, chemical mechanical polishing slurry compositions comprising silica ($SiO_2$), hydrogen peroxide, nano-ferrosilicon (FeSi) as a non-ionized, heat-activated nano-catalyst according to the present invention and deionized waster were prepared (Examples 1 to 5). Also, a chemical mechanical polishing slurry composition was prepared using ferric nitrate ($Fe(NO_3)_3$) as a conventional catalyst instead of the non-ionized, heat-activated nano-catalyst (Comparative Example 1). The prepared slurry compositions were used to polish tungsten wafers having a 0.8 μm-thick tungsten layer formed thereon, and the polishing results are shown in Table 1. The polishing process was carried out using Frex-200 CMP Polisher (Ebara, Japan) as a polishing machine and IC1000 (Rohm & Haas, USA) as a polishing pad. The polishing conditions were as follows: a pad pressure of 200 hPa, a pad rotation speed of 90 rpm, and a slurry flow rate of 150 ml/min.

TABLE 1

|   | Silica Contents (wt %) | Hydrogen Peroxide Contents (wt %) | Ferric Nitrate ($Fe(NO_3)_3$) Contents (ppm) | Nano-Ferrosilicon (FeSi) Contents (ppm) | Removal Rate (Å/min) | Roughness (%) |
|---|---|---|---|---|---|---|
| Example 1 | 1.0 | 3.0 | None | 17 | 867 | 2.86 |
| Example 2 | 1.5 | 3.0 | None | 17 | 976 | 2.37 |
| Example 3 | 2.0 | 3.0 | None | 17 | 1,005 | 1.42 |
| Example 4 | 2.5 | 3.0 | None | 17 | 1,063 | 3.13 |
| Example 5 | 3.0 | 3.0 | None | 17 | 1,152 | 3.29 |
| Comp. Ex. 1 | 3.0 | 3.0 | 434 | None | 1,000 | 5.00 |

The content of iron ions in the composition of Comparative Example 1 was 60 ppm (see Experimental Example 4 below). The content of iron in the nano-ferrosilicon (FeSi) used in Examples 1 to 5 was 8 ppm (based on the total weight of the composition), and the iron was not present in the form of ions. Also, in Table 1 above, the removal rate and roughness are values relative to the case in which the removal rate and roughness of Comparative Example 1 were normalized to 1000 Å/min and 5%, respectively. As can be seen from the results from Table 1 above, as the content of the abrasive particle silica increased, the removal rate linearly increased. In comparison with the prior slurry composition of Comparative Example 1, in the cases in which the abrasive particles (silica) were used in the same amount (Example 5 and Comparative Example 1), the inventive slurry showed a removal rate which was higher than that for the prior slurry by about 15%.

Examples 6 to 9 and Comparative Example 1

Tests for Removal Rate of Tungsten Layer at Various Contents of Oxidizing Agent

As shown in Table 2 below, chemical mechanical polishing slurry compositions comprising silica ($SiO_2$), hydrogen peroxide, nano-ferrosilicon (FeSi) as a non-ionized, heat-activated nano-catalyst according to the present invention and deionized waster were prepared (Examples 6 to 9). Also, a chemical mechanical polishing slurry composition was prepared using ferric nitrate ($Fe(NO_3)_3$) as a conventional catalyst instead of the non-ionized, heat-activated nano-catalyst (Comparative Example 2). Polishing was carried out using the prepared slurry compositions in the same conditions as in Examples 1 to 5, and the polishing results are shown in Table 2 below.

TABLE 2

|   | Silica Contents (wt %) | Hydrogen Peroxide Contents (wt %) | Ferric Nitrate ($Fe(NO_3)_3$) Contents (ppm) | Nano-Ferrosilicon (FeSi) Contents (ppm) | Removal Rate (Å/min) | Roughness (%) |
|---|---|---|---|---|---|---|
| Exam- | 2.0 | 1.5 | None | 17 | 740 | 2.67 |

TABLE 2-continued

| | Silica Contents (wt %) | Hydrogen Peroxide Contents (wt %) | Ferric Nitrate (Fe(NO$_3$)$_3$) Contents (ppm) | Nano-Ferrosilicon (FeSi) Contents (ppm) | Removal Rate (Å/min) | Roughness (%) |
|---|---|---|---|---|---|---|
| Example 6 | | | | | | |
| Example 7 | 2.0 | 2.0 | None | 17 | 839 | 2.60 |
| Example 8 | 2.0 | 2.5 | None | 17 | 954 | 2.67 |
| Example 9 | 2.0 | 3.0 | None | 17 | 1,005 | 1.42 |
| Example 5 | 3.0 | 3.0 | None | 17 | 1,152 | 3.29 |
| Comp. Ex. 2 | 3.0 | 2.0 | 434 | None | 787 | 5.38 |
| Comp. Ex. 1 | 3.0 | 3.0 | 434 | None | 1,000 | 5.00 |

The content of iron ions in the compositions of Comparative Examples 1 and 2 was 60 ppm. The content of iron in the nano-ferrosilicon (FeSi) used in Examples 6 to 9 was 8 ppm, and the iron was not present in the form of ions. Also, in Table 2 above, the removal rate and roughness are values relative to the case in which the removal rate and roughness of Comparative Example 1 were normalized to 1000 Å/min and 5%, respectively. As can be seen from the results from Table 2 above, as the content of hydrogen peroxide used as the oxidizing agent increased, the removal rate increased. The slurry compositions of Examples 6 to 9 showed removal rate and roughness which were equal or superior to those of the prior slurry compositions of Comparative Examples 1 and 2.

Examples 10 to 18 and Comparative Example 1

Tests for Removal Rates at Various Contents of Nano-Catalysts

As shown in Table 3 below, chemical mechanical polishing slurry compositions comprising silica (SiO$_2$), hydrogen peroxide, nano-ferrosilicon (FeSi) as a non-ionized, heat-activated nano-catalyst according to the present invention and deionized waster were prepared (Examples 10 to 18). Also, a chemical mechanical polishing slurry composition was prepared using ferric nitrate (Fe(NO$_3$)$_3$) as a conventional catalyst instead of the non-ionized, heat-activated nano-catalyst (Comparative Example 2). Polishing was carried out using the prepared slurry compositions in the same conditions as in Examples 1 to 5, and the polishing results are shown in Table 3 below.

TABLE 3

| | Silica Contents (wt %) | Hydrogen Peroxide Contents (wt %) | Ferric Nitrate (Fe(NO$_3$)$_3$) Contents (ppm) | Nano-Ferrosilicon (FeSi) Contents (ppm) | Removal Rate (Å/min) | Roughness (%) |
|---|---|---|---|---|---|---|
| Example 10 | 2 | 3 | None | 0.1 | 47 | 17.4 |
| Example 11 | 2 | 3 | None | 1 | 133 | 2.2 |
| Example 12 | 2 | 3 | None | 5 | 722 | 4.4 |
| Example 9 | 2 | 3 | None | 17 | 1,005 | 1.4 |
| Example 13 | 2 | 3 | None | 34 | 1,107 | 2.3 |
| Example 14 | 2 | 3 | None | 64 | 1,121 | 3.0 |
| Example 15 | 2 | 3 | None | 128 | 1,118 | 3.4 |
| Example 16 | 2 | 3 | None | 255 | 1,057 | 2.7 |
| Example 17 | 2 | 3 | None | 510 | 1,087 | 3.0 |
| Example 18 | 2 | 3 | None | 1,000 | 1,127 | 3.2 |
| Comp. Ex. 1 | 3 | 3 | 434 | None | 1,000 | 5.0 |

The content of iron ions in the composition of Comparative Examples 1 was 60 ppm. The content of iron in the nano-ferrosilicon (FeSi) used in Examples 10 to 18 ranged from 100 ppb to 1,000 ppm, and the iron was not present in the form of ions. Also, in Table 3 above, the removal rate and roughness are values relative to the case in which the removal rate and roughness of Comparative Example 1 were normalized to 1000 Å/min and 5%, respectively. As can be seen in Table 3 above, as the content of the nano-ferrosilicon (catalyst) increased, the removal rate increased. When the content of the nano-ferrosilicon was more than 17 ppm, the removal rate was maintained at a substantially constant level. When examining the post-polish roughness in the cases of applying the nano-ferrosilicon in comparison with Comparative Example 1, the roughness in the case of applying the nano-ferrosilicon was more uniform except for Example 10 in which a very small amount of the ferrosilicon was used.

Examples 19 to 21

Tests for Polishing Performance of Metal Silicides (MSi) with Different Transition Metals The polishing performance of ferrosilicon and metal silicides (MSi) with different transition metals was comparatively tested, and the test results are shown in Table 4 below. As can be seen from the results in Table 4, the removal rate of the tungsten substrate in the cases of manganese silicide and cobalt silicide was reduced compared to the case of nano-ferrosilicide, but the polishing function thereof could be confirmed. Accordingly, it could be found that other transition metal silicides such as manganese silicide and cobalt silicide, in addition to ferrosilicide as the non-ionized heat-activated nano-catalyst, also belong to a class of non-ionized, heat-activated nano-catalysts which release electrons and holes by energy generated in chemical mechanical polishing processes.

The polishing performance tests were carried out using the same polishing machine, method and conditions as in Examples 1 to 5. Specifically, the polishing process was carried out using Frex-200 CMP Polisher (Ebara, Japan) as a polishing machine and IC1000 (Rohm & Haas, USA) as a polishing pad, and the polishing conditions were as follows: a pad pressure of 200 hPa, a pad rotation speed of 90 rpm, and a slurry flow rate of 150 ml/min.

TABLE 4

| Division | Silica Contents (w %) | Nano-ferrosilicide (ppm) | Manganese Silicide (ppm) | Cobalt Slicide (ppm) | Hydrogen Peroxide (w %) | Reaction Regulating Agent (w %) | Removal Rate (Å/min) | Roughness (%) |
|---|---|---|---|---|---|---|---|---|
| Example 19 | 3.0 | 0 | 0 | 17 | 3.0 | 0.01 | 613 | 6.33 |
| Example 20 | 3.0 | 0 | 17 | 0 | 3.0 | 0.01 | 748 | 5.70 |
| Example 21 | 3.0 | 17 | 0 | 0 | 3.0 | 0.01 | 1000 | 4.08 |

Experimental Examples 1 to 3

Experiments of Reactivity by Thermal Energy

To examine the reactivity between the oxidizing agent (hydrogen peroxide) and the catalyst, 3.0 wt % of the oxidizing agent was added to each of an aqueous solution containing pure deionized water and 0.0017 wt % of nano-ferrosilicon (Fe content: 8 ppm) as the non-ionized, heat-activated nano-catalyst according to the present invention, and an aqueous solution containing 0.0434 wt % of ferric nitrate ((Fe(NO$_3$)$_3$; Fe content: 60 ppm) as the prior catalyst, and the states (the change in color caused by reaction with the oxidizing agent, and the generation of bubbles) of the aqueous solutions were observed. Also, the aqueous solutions were heated to 60° C., and the oxidizing agent was then added thereto, after which the states of the aqueous solutions were observed. The observation results are shown in Table 5 below.

TABLE 5

| | Catalyst | Before Addition of Oxidizing Agent | Immediately After Addition of Oxidizing Agent | Immediately After Heating to 60° C. | Within 30 mins After Heating to 60° C. |
|---|---|---|---|---|---|
| Experimental Example 1 | None | Clear | No Change | No Change | No Change |
| Experimental Example 2 | Heat-Activated Nano Catalyst | Clear | No Change | Excessive Amount of Bubbles Generated/ Light Yellow | Excessive Amount of Bubbles Generated/ (90 mins) |
| Experimental Example 3 | Ferric Nitrate | Light Brown | Excessive Amount of Bubbles Generated/ Brown | Excessive Amount of Bubbles Generated/ Brown | Reaction Terminated/ Dark Brown |

As can be seen from the results in Table 5 above, the aqueous solution containing 0.0017 wt % of nano-ferrosilicon as the non-ionized, heat-activated nano-catalyst according to the present invention did not react when the oxidizing agent was added. However, when the oxidizing agent was added to the aqueous solution after heating the aqueous solution to 60° C. on a hot plate, a reaction (bubble generation) occurred for 90 minutes, and after completion of the reaction, the aqueous solution showed a clear color (Experimental Example 2). On the contrary, the aqueous solution containing 0.0434 wt % of ferric nitrate ((Fe(NO$_3$)$_3$) as the prior catalyst showed a light brown color when the oxidizing agent was added. Also, it generated bubbles (Fenton oxidation; a chemical reaction frequently used in wastewater treatment plants) at room temperature immediately after addition of the oxidizing agent), and the reaction was terminated within 30 minutes after heating to 60° C. Finally, the aqueous solution showed a dark brown color. Meanwhile, in the case in which only the oxidizing agent (hydrogen peroxide) was added without adding the catalyst (Experimental Example 3), there was no reaction at room temperature and a heated state, suggesting that the aqueous solution was not decomposed by the oxidizing agent alone and did not generate bubbles, even when heat was applied thereto. In the case in which the non-ionized, heat-activated nano-catalyst according to the present invention was used, very fine bubbles were generated compared to the case in which ferric nitrate was used. As can be seen from the above experimental results, unlike the prior reaction mechanism utilizing ferric nitrate, the heat-activated nano-catalyst according to the present invention generates electrons in a thermally excited state, which react with hydrogen peroxide.

Experimental Example 4

Relationship Between Polishing Temperature and Removal Rate

In order to examine the relationship between polishing temperature and removal rate, a wafer having a 8,000 Å-thick tungsten (W) CVD (chemical vapor deposition) film coated thereon was polished using a CMP system (FREX-200, Ebara, Japan) and the chemical mechanical polishing slurry composition of Example 7. The change in the temperature of the surface of the pad (IC 1000, Rohm & Haas, USA) during the polishing process was measured by using an IR sensor (SK-8700; SATO, Japan) to detect the temperature of the pad surface closest to the CMP head, and the measurement results are shown in FIG. 1. As can be seen in FIG. 1, after about 30-40 seconds after the start of polishing, the polishing temperature increased to and was maintained at about 50° C.

Figure 2:
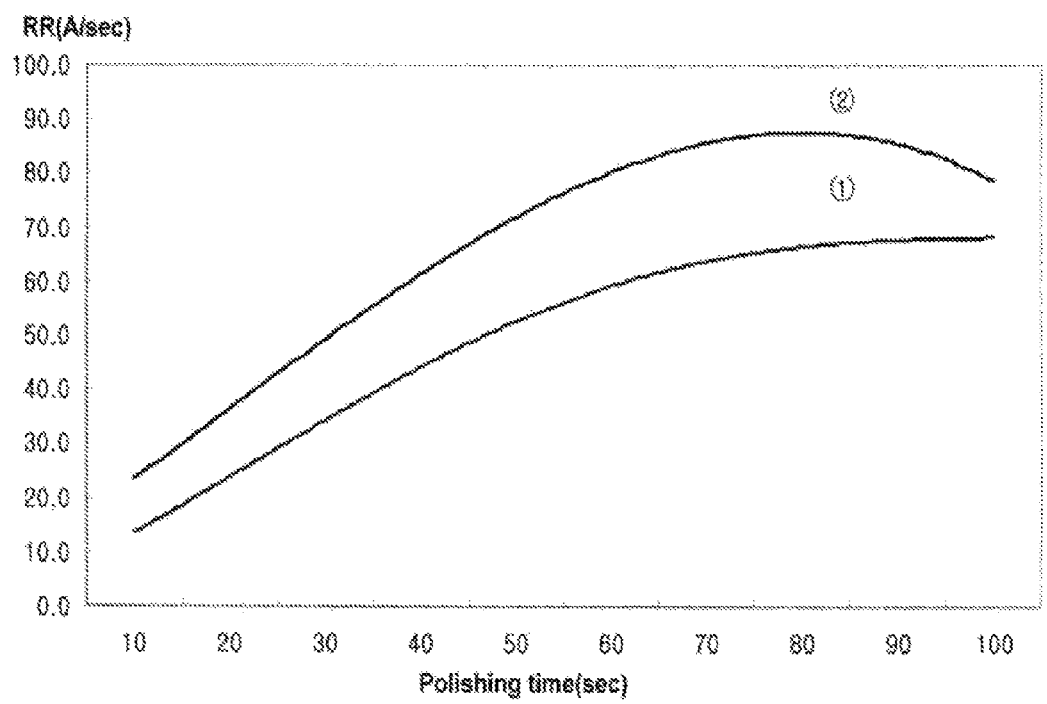
FIG. 2 is a graph showing the removal rate of a tungsten (W) film as a function of polishing time in the case of polishing a tungsten (W) film using a chemical mechanical polishing slurry composition according to the present invention.

In addition, the removal rate (Å/sec) of the W film according to polishing time (sec) was measured, and the measurement results are shown in FIG. 2. In FIG. 2, "①" is removal rate (RR) obtained in the case of the slurry composition of Example 7 having a silica abrasive content of 2 wt % and an oxidizing agent content of 2 wt %, and ② is removal rate (RR) obtained in the case of using the slurry composition of Example 5 having a silica abrasive content of 3 wt % and an oxidizing agent content of 3 wt %. As can be seen in FIG. 2, during the chemical mechanical polishing process, thermal energy was maintained constant at a specific level rather than continuing to increase, and thus the removal rate of the metal (W) film was also maintained constant at a specific level. Namely, it can be seen that, when the polishing process is carried out using the slurry composition according to the present invention, the removal rate is maintained within a specific range, and when the content of the abrasive particles or the oxidizing agent increases, the polishing rate also increases.

Experimental Example 5

Experiment for Detection of Fe Ions in Slurry Composition Using Electrophoresis

In order to examine whether or not Fe ions are present in slurries, a slurry containing 17 ppm of nano-ferrosilicon (FeSi) as the non-ionized, heat-activated nano-catalyst according to the present invention, and a slurry containing 434 ppm of ferric nitrate ($Fe(NO_3)_3$) as the prior catalyst were prepared. Then, each of the slurries was separated into the abrasive particles and the liquid phase using an ultra-high-speed centrifuge. The separated liquid phase samples were collected and injected into a column for 60 seconds and electrophoresed to detect the presence of Fe ions in the samples. The experimental results are shown in Table 6 below. In the above experiment, a CAPI-3200 system (Otsuka Electronics, Japan) was used as an electrophoresis system, a column having a diameter of 75 μm and a length of 50 cm was used, and an $Fe^{3+}$ buffer solution was used as an eluent. The detection limit of the system used was 1 ppm. Meanwhile, the slurry containing 17 ppm of nano-ferrosilicon (FeSi) was dissolved completely with an acid and analyzed by ICP-MS (inductively coupled plasma mass spectrometry), and the analysis results showed that the content of Fe in the slurry was 8 ppm.

| Samples | Analysis Result of Fe Ions |
|---|---|
| Slurry containing 17 ppm of Nano-Ferrosilicon (FeSi) | ND(Not-Detected) |
| Slurry containing 434 ppm of Ferric Nitrate (Fe(NO3)3) | 60 ppm |

As can be seen from the results in Table 6 above, Fe ions were not present in the slurry containing the nano-ferrosilicon (FeSi) as the non-ionized, heat-activated nano-catalyst as the present invention, whereas a large amount of Fe ions were present in the slurry containing ferric nitrate ($Fe(NO_3)_3$).

Experimental Example 6

Experiment for Detection of Fe Ions in Slurry Solution Remaining after CMP

After the chemical mechanical (CMP) process, in order to examine whether or not the non-ionized, heat-activated nano-catalyst was dissociated into ions due to the influence of chemical and mechanical environments, an experiment for the detection of Fe ions was carried out.

After the CMP process, in order to examine whether or not Fe ions were generated, polishing was carried out using each of a slurry composition containing the non-ionized, heat-activated nano-catalyst and a slurry composition containing ferric nitrate, the detection of Fe ions in the remaining slurry solutions was performed. Specifically, the polishing was carried out using each of the slurry composition of Example 5 having a silica abrasive content of 3 wt %, an oxidizing agent content of 3 wt % and a nano-ferrosilicon content of 17 ppm and the slurry composition of Comparative Example 1 having a silica abrasive content of 3 wt %, an oxidizing agent content of 3 wt % and a ferric nitrate ($Fe(NO_3)_3$) content of 434 ppm in the same conditions as in Examples 1 to 5. Fe ions in the slurries remaining after the polishing were analyzed and the analysis results are shown in Table 7 below. In the above experiment, CAPI-3200 was used as an analysis system, and the Fe ions were measured at 235 nm at room temperature by a fused silica capillary column (I.D.: 75 μm, and length: 50 cm) using an $Fe^{3+}$ buffer solution as a standard. The detection limit of the system used was 1 ppm.

As shown in Table 7 indicating the results of the Fe ion detection experiment, Fe ions were detected in Comparative Example 1 after the CMP process, whereas the presence of Fe ions was not detected in Example 5 even after the CMP process in the same manner as before the CMP process.

The above experimental results suggest that the heat-activated nano-catalyst is not ionized even by the pressure and friction occurring during the CMP process.

TABLE 7

| | Silica Contents (wt %) | Hydrogen Peroxide Contents (wt %) | Ferric Nitrate ($Fe(NO_3)_3$) Contents (ppm) | Nano-Ferrosilicon (FeSi) Contents (ppm) | Removal Rate (Å/min) | Fe Ions (ppm) |
|---|---|---|---|---|---|---|
| Example 5 | 3.0 | 3.0 | None | 17 | 1,152 | N.D. |
| Comp. Ex. 1 | 3.0 | 3.0 | 434 | None | 1,000 | 10.6 |

Experimental Example 7

Experiment for Detection of Impurities on Wafer Surface after CMP

In order to examine whether or not Fe ions were detected in slurries, a wafer was polished using each of a slurry composition containing the non-ionized, heat-activated nano-catalyst and a slurry composition containing ferric nitrate, and then the detection of impurities on the wafer surface was conducted. As the slurry composition containing the non-ionized, heat-activated nano-catalyst, the slurry composition of Example 5 having a silica abrasive content of 3 wt %, an oxidizing agent content of 3 wt % and a nano-ferrosilicon content of 17 ppm was used, and as the slurry composition containing ferric nitrate, the slurry composition of Example 1 having a silica abrasive content of 3 wt %, an oxidizing agent content of 3 wt % and a ferric nitrate ($Fe(NO_3)_3$) of 434 ppm was used.

The above polishing process was carried out using the same method, machine and conditions as in Examples 1 to 5. Specifically, the polishing process was carried out using a Frex-200 CMP Polisher (Ebara, Japan) as a polishing machine and IC1000 (Rohm & Haas, USA as a polishing pad, and the polishing conditions were as follows: a pad pressure of 200 hPa, a pad rotation speed of 90 rpm, and a slurry flow rate of 150 ml/min. Under the above polishing conditions, a tungsten wafer having a 0.8 μm-thick tungsten film formed thereon was polished.

After the polishing process, the wafer was washed with deionized water (DIW) and rinsed with dilute ammonia solution, and then impurities on the wafer surface were measured using TXRF 3750 (Rigaku). The detection limit of the measurement system used was $10^8$ atoms/cm$^2$. After the wafer had been polished by CMP using each of the slurry composition containing the non-ionized, heat-activated nano-catalyst and the slurry composition containing ferric nitrate, impurities on the wafer surface were measured.

TABLE 8

| Samples | Na | Mg | Al | Cr | Mn | Fe | Ni | Co | Cu | Zn |
|---|---|---|---|---|---|---|---|---|---|---|
| reference[Note 1] (Blanket Wafer) | N.D | N.D | N.D | 2.8 | N.D | 4.7 | 2.1 | N.D | 0.6 | 1.8 |
| Slurry containing Non-Ionized, Heat-Activated Nano-Catalyst | N.D | N.D | N.D | 2.4 | N.D | 5.2 | 2.4 | N.D | N.D | N.D |
| Slurry containing Ferric Nitrate | 48.7 | 72.4 | 10.1 | 2.7 | 0.2 | 197.2 | 2.3 | N.D | 6.2 | 13.4 |

Unit: ×10^10 Atoms/cm² (applied to all numeric columns)

Note
[1])Reference shows measurement results for impurities on a clean blanket wafer surface before CMP.

As can be seen in Table 8, in the case of the slurry containing the non-ionized, heat-activated nano-catalyst, precipitates of Fe ions, etc., which cause substrate contamination during the CMP process, did not act as impurities on the wafer, unlike the case of the slurry containing ferric nitrate. In addition, a very small increase in the amounts of Fe and Ni metals was presumed to be attributable to mechanical action in the polishing process, and any substantial increase in impurities caused by ionization did not was not shown in the materials other than Fe and Ni.

Experimental Example 8

Experiment for Detection of Fe Ions in Slurry Compositions Using EPR

Figure 3:
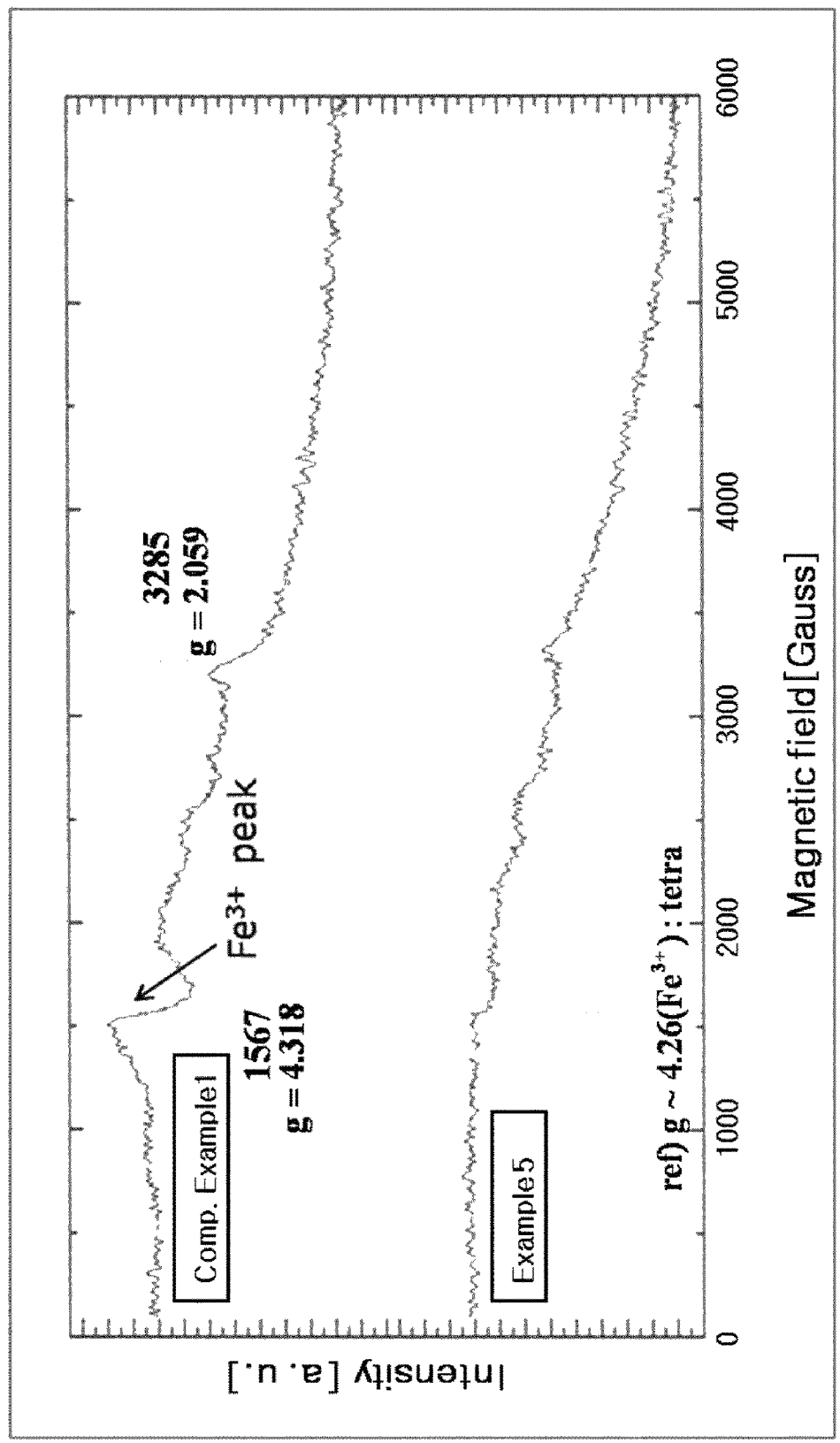
FIG. 3 is a graph showing whether or not Fe ions are detected in a chemical mechanical polishing slurry composition according to the present invention and a slurry composition containing ferric nitrate ($(Fe(NO_3)_3)$)

In order to examine whether or not Fe ions are present in slurries, the slurry composition (Example 5) containing 17 ppm of nano-ferrosilicon (FeSi) as the non-ionized, heat-activated nano-catalyst according to the present invention, and the slurry composition (Comparative Example 1) containing 434 ppm of ferric nitrate ($Fe(NO_3)_3$) as the prior art catalyst were freeze-dried to prepare solid samples. The presence of Fe ions in the samples was analyzed using EPR (electron paramagnetic resonance) at X-band microwave frequency (9.3 GHz) at a magnetic field modulation of 100 kHz, and the analysis results are shown in FIG. 3. In the above experiment, Bruker E500 was used in the EPR analysis.

As can be seen from FIG. 3, the analysis results of EPR data on the slurry containing nano-ferrosilicon as the non-ionized, heat-activated nano-catalyst according to the present invention and on the slurry containing ferric nitrate ($Fe(NO_3)_3$) revealed that the presence of Fe ions ($Fe^{3+}$) in the slurry of the present invention was not detected and the difference between the inventive slurry and the prior slurry was evident.

Example 9

Analysis of Binding State of Heat-Activated Nano-Catalyst (FeSi) Using XPS (X-ray Photoelectron Spectroscopy)

In order to analyze the binding state of the heat-activated nano-catalyst, nano-ferrosilicon as the non-ionized; heat-activated nano-catalyst according to the present invention, and commercially available ferroaluminum (FeAl), cobalt amuminate (CoAl) and cobalt silicate (CoSi) were prepared as solid samples (size of 7×7 mm to 10×10 mm). Alka radiation sources having a spot size of 60-800 μm were used as X-ray photons in a ultra-high vacuum (UHV). In the above experiment, a PHI 5800 ESCA system was used as the XPS system.

Figure 4:
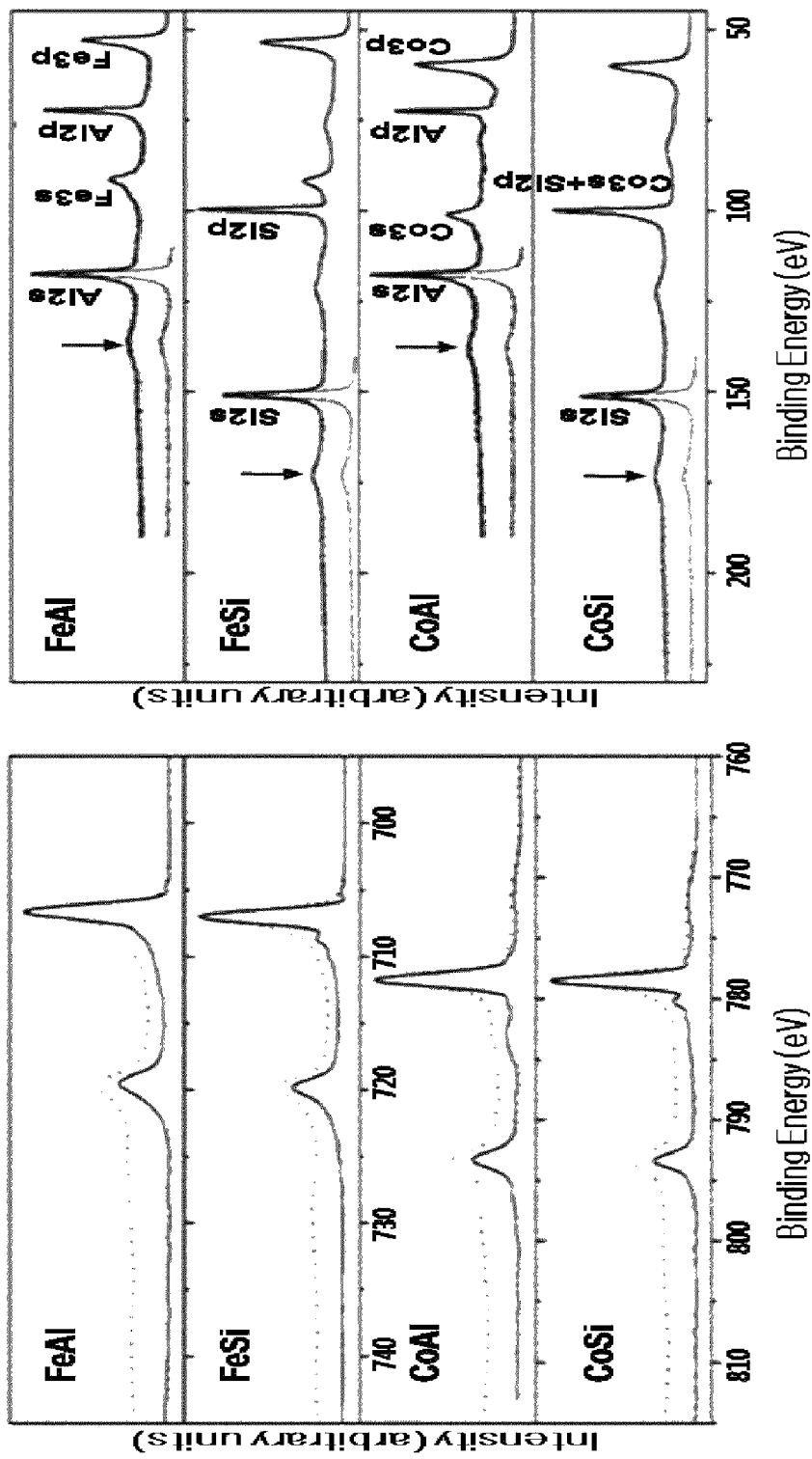
FIG. 4 is a graph showing the binding state of nano-ferro-silicon (FeSi) which is used as a nano-catalyst in a chemical mechanical polishing slurry composition according to the present invention wherein FIG. 4(*a*) shows results of XPS qualitative analysis in a wide scan region.
Figure 4:
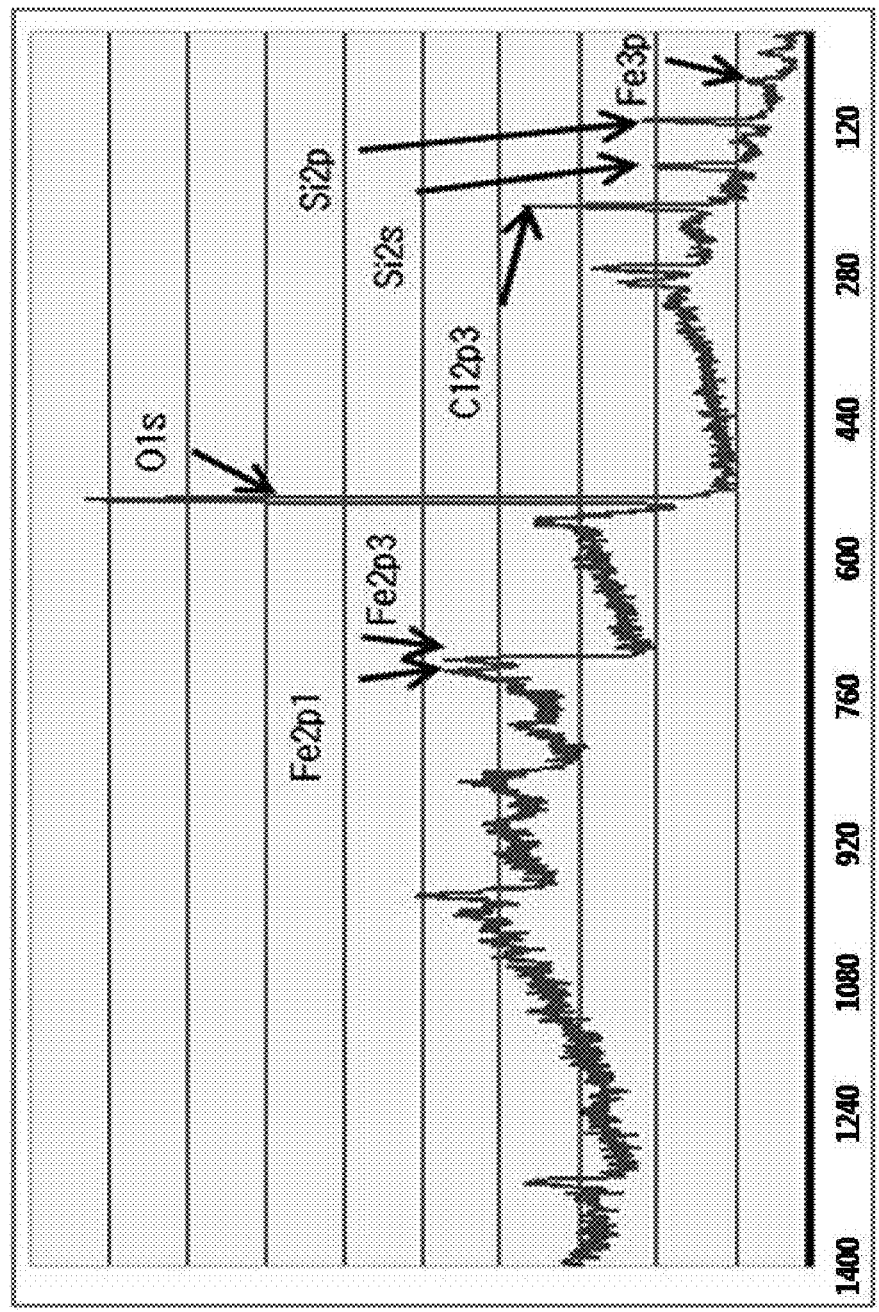

As can be seen in FIG. 4 showing analysis results for the binding state of FeSi, the presence of synthesized FeSi could be found in a wide scan region, and a narrow scan region showed that FeSi was present in a bound state.

Although the present invention has been described in detail with reference to the specific features, it will be apparent to those skilled in the art that this description is only for a preferred embodiment and does not limit the scope of the present invention. Thus, the substantial scope of the present invention will be defined by the appended claims and equivalents thereof.

What is claimed is:

1. A chemical mechanical polishing slurry composition for use in a process for chemical mechanical polishing a substrate by a polishing pad, the composition comprising:
    a non-ionized, heat-activated nano-catalyst which is able to release electrons and holes by thermal energy generated by friction between the substrate and the polishing pad;
    an abrasive; and
    an oxidizing agent,
    wherein the non-ionized, heat-activated nano-catalyst and the abrasive are different from each other, and the content of the non-ionized, heat-activated nano-catalyst is 0.00001 to 0.1 wt % based on the total weight of the chemical mechanical polishing slurry composition.

2. The chemical mechanical polishing slurry composition of claim 1, wherein the non-ionized, heat-activated nano-catalyst is a transition metal silicide represented by MSi (where M is a transition metal).

3. The chemical mechanical polishing slurry composition of claim 1, wherein the non-ionized, heat-activated nano-catalyst is selected from the group consisting of CrSi, MnSi, CoSi, ferrosilicon (FeSi), and mixtures thereof.

4. The chemical mechanical polishing slurry composition of claim 1, wherein the non-ionized, heat-activated nano-catalyst is ferrosilicon (FeSi).

5. The chemical mechanical polishing slurry composition of claims 1, wherein the non-ionized, heat-activated nano-catalyst is a semiconductor material which releases electrons and holes at a temperature of 10 to 100° C. in an aqueous solution state.

6. The chemical mechanical polishing slurry composition of claim 5, wherein the non-ionized, heat-activated nano-catalyst has a particle size of 1-20 nm.

7. The chemical mechanical polishing slurry composition of claim 6, wherein the content of the abrasive is preferably 0.1 to 20.0 wt %.

8. The chemical mechanical polishing slurry composition of claim 7, wherein the content of the non-ionized, heat-activated nano-catalyst in the chemical mechanical polishing slurry composition is 0.00005-0.07 wt %.

9. The chemical mechanical polishing slurry composition of claims 1, wherein the abrasive is selected from the group consisting of fumed silica, colloidal silica, γ-alumina or α-alumina, ceria, Germania, titania, zirconia, and mixtures thereof.

10. The chemical mechanical polishing slurry composition of claims 1, wherein the oxidizing agent is selected from the group consisting of monopersulfates, persulfates, peroxides, periodates, and mixtures thereof, and the content of the oxidizing agent in the slurry composition of the present invention is 0.1-10.0 wt %.

11. A method for polishing a substrate, comprising the steps of:
applying to a substrate having a metal layer formed thereon a chemical mechanical polishing slurry composition;
bringing the substrate having the chemical mechanical polishing composition applied thereto into contact with a polishing pad, and
allowing the polishing pad, the substrate, or both to move; and
removing at least a portion of the metal layer from the substrate,
wherein the chemical mechanical polishing slurry composition comprises a non-ionized, heat-activated nano-catalyst, an abrasive, and an oxidizing agent;
wherein the non-ionized, heat-activated nano-catalyst is able to release electrons and holes by thermal energy generated by the movement of the polishing pad, the substrate, or both,
wherein the non-ionized, heat-activated nano-catalyst and the abrasive are different from each other, and
wherein the content of the non-ionized, heat-activated nano-catalyst is 0.00001 to 0.1 wt % based on the total weight of the chemical mechanical polishing slurry composition.

12. The method of claim 11, wherein the metal layer is selected from the group consisting of a titanium layer, a titanium nitride layer and a tungsten layer.

* * * * *